US009225305B2

(12) United States Patent
Griffiths et al.

(10) Patent No.: US 9,225,305 B2
(45) Date of Patent: Dec. 29, 2015

(54) SYSTEM AND METHODS FOR APPLYING BASS COMPENSATION

(71) Applicants: Dennis L. Griffiths, Mountlake Terrace, WA (US); Robert Charles Winegar, Mountlake Terrace, WA (US)

(72) Inventors: Dennis L. Griffiths, Mountlake Terrace, WA (US); Robert Charles Winegar, Mountlake Terrace, WA (US)

(73) Assignee: AUDIOCONTROL, INC., Mountlake Terrace, WA (US)

( * ) Notice: Subject to any disclaimer, the term of this patent is extended or adjusted under 35 U.S.C. 154(b) by 271 days.

(21) Appl. No.: 13/770,562

(22) Filed: Feb. 19, 2013

(65) Prior Publication Data

US 2013/0156225 A1    Jun. 20, 2013

Related U.S. Application Data

(63) Continuation-in-part of application No. 13/243,707, filed on Sep. 23, 2011, now abandoned.

(60) Provisional application No. 61/403,871, filed on Sep. 23, 2010, provisional application No. 61/572,025, filed on Jul. 11, 2011.

(51) Int. Cl.
*H03G 5/00* (2006.01)
*H03G 3/00* (2006.01)
*H03G 5/18* (2006.01)

(52) U.S. Cl.
CPC ................ *H03G 3/00* (2013.01); *H03G 5/005* (2013.01); *H03G 5/18* (2013.01)

(58) Field of Classification Search
None
See application file for complete search history.

(56) References Cited

U.S. PATENT DOCUMENTS

| | | | |
|---|---|---|---|
| 3,803,359 A | | 4/1974 | Corderman |
| 4,764,967 A | * | 8/1988 | Christopher .................... 381/98 |
| 5,046,105 A | | 9/1991 | Bohn |
| 5,673,326 A | | 9/1997 | Goldfarb |
| 8,054,993 B1 | | 11/2011 | Kreifeldt et al. |
| 2002/0048378 A1 | | 4/2002 | Oki |
| 2002/0164039 A1 | * | 11/2002 | Carter et al. .................. 381/111 |
| 2003/0035549 A1 | * | 2/2003 | Bizjak et al. .................... 381/56 |
| 2004/0022400 A1 | * | 2/2004 | Magrath ........................ 381/106 |
| 2005/0094828 A1 | * | 5/2005 | Sugimoto ........................ 381/98 |
| 2009/0052695 A1 | | 2/2009 | Yamada et al. |
| 2010/0215192 A1 | * | 8/2010 | Minnaar .......................... 381/98 |
| 2012/0076324 A1 | | 3/2012 | Griffiths |

OTHER PUBLICATIONS

Bohn, Dennis A., "Accelerated Slope Tone Control Equalizers", J. Audio Eng. Soc., vol. 40, No. 12, Dec. 1992, 7 pages total.
Fletcher, Harvey et al., "Loudness, Its Definition, Measurement and Calculation", Journal of the Acoustic Society of America, vol. 5, Oct. 1933, 27 pages total.

* cited by examiner

*Primary Examiner* — Thang Tran
(74) *Attorney, Agent, or Firm* — Dorsey & Whitney LLP

(57) ABSTRACT

Systems and methods for providing bass compensation to correct for uneven bass response are disclosed. An example bass compensation system includes a low pass filter configured to receive an audio signal from an audio source and provide a filtered audio signal, the low pass filter having a roll off of at least 18 dB per octave. The bass compensation system further includes a summing amplifier coupled to the low pass filter and configured to sum the audio signal from said audio source and the filtered audio signal to provide a summed audio signal, wherein the summed audio signal provided by the summing amplifier provides a bass boost at a first frequency and mid bass cut at a second frequency greater than the first frequency.

17 Claims, 10 Drawing Sheets

SYSTEM AND METHODS FOR APPLYING BASS COMPENSATION

CROSS-REFERENCE TO RELATED APPLICATION(S)

This application is a continuation-in-part of pending U.S. patent application Ser. No. 13/243,707, filed Sep. 23, 2011, which application claims benefit of Provisional Application Nos. 61/403,871 filed on Sep. 23, 2010, and 61/572,025 filed on Jul. 11, 2011. These applications are incorporated herein by reference, in their entirety, for any purpose.

TECHNICAL FIELD

The present invention relates generally to improving bass response in, acoustic environments, and more particularly, to improving bass response by providing a system to compensate for lack of bass and problem of undesirable mid bass resonance in acoustic environments.

BACKGROUND OF THE INVENTION

The acoustic environment of automobiles and/or rooms (e.g., in a home, office, theatre, other building or enclosure, etc.) is difficult and may present challenges to reproduce a satisfying audio experience. For example, automobile audio system design and the acoustics of an automobile may contribute to the loss of bass. Loss of bass can be attributed to the inability of loudspeakers to reproduce lower frequencies along with a low frequency roll off attributed to factory speaker protection systems that limit bass output at higher listening levels. The physical location of the loudspeakers also becomes a factor in sound quality having an impact on the low frequency and high frequency response. Automobiles also work as sealed enclosures that produce mid bass resonance making the bass response unnatural sounding. Last the sensitivity of the ear at low frequencies is not the same at low levels as it is at higher levels as explained by Harvey Fletcher et al., *Loudness, Its Definition, Measurement and Calculation*, in Journal of the Acoustic Society of America, Vol. 5, October 1933. It is widely known that the low frequency response in an automobile given the many factors of speaker placement, listening position and automobile resonance, make it quite difficult to make the automobile audio systems sound equivalent to that of a high end stereo system.

It is generally accepted that the interior of an automobile is far from being an ideal listening space. One of its most obvious flaws is a dominant resonance at 250-300 Hz that makes the bass lose tonality and unnatural sounding. This resonance reinforces the mid bass produced by a typical sound system in an automobile and while this resonance can be used to an advantage in competitive high SPL autosound competitions is not helpful to the objective of reproducing good sound in an automobile Several approaches have been taken to compensate for low frequency roll off in an automobile environment. Graphic equalizers are typically used to make the necessary compensation that is usually done after measurements have been made with a ⅓-octave real time analyzer. This requires the end user to have some skill and audio knowledge to use the analyzer and then apply that to the equalizer.

The concept of an accelerated slope tone control for bass compensation was introduced by Dennis A. Bohn in *Accelerated Slope Tone Control Equalizers*, J. Audio Eng. Soc., Vol. 40, No. 12, December 1992, and U.S. Pat. No. 5,046,105 issued Sep. 3, 1991 describes a system that improved the function of typical bass and treble tone controls. This concept demonstrated the use of 2nd and 3rd order filters with an added zero offset for each additional pole to eliminate phase cancellations in the mid bass. The advantage of the accelerated slope tone control concept is to reduce mid band interaction inherent in bass and treble tone controls.

Additionally, numerous methods exist that improve the bass response of smaller loudspeakers with limited bandwidth. The most significant improvement in sound reproduction in a vehicle is to typically add bass loudspeakers and power amplification.

Further, audio quality in an acoustic environment can be affected by the geometry of a listening space. For example, acoustic environments may have null regions caused by standing waves. Additionally, some devices used in room environments may use bass roll off to protect small speakers included in or used by the device to produce audio. Thus, what is needed, is a method to optimize the use of the aforementioned improvements in acoustic environments, such as, for example, a vehicle environment and/or a room environment.

DETAILED DESCRIPTION OF PREFERRED EMBODIMENTS

Figure 1:
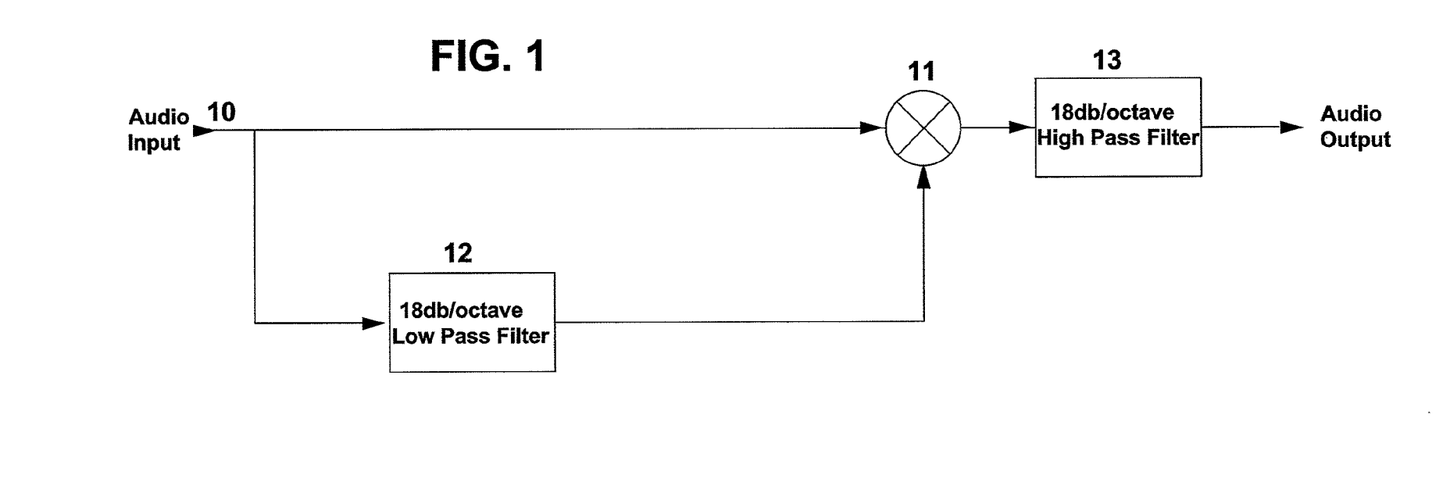
FIG. 1 is a block diagram of a bass compensation system according to an embodiment of the present invention.

Embodiments of the invention provide bass compensation to compensate for difficult acoustic environments and the loss of bass from various circumstances. For example, difficult acoustic environments may include an automobile, a room (e.g., in a home, office, theatre, or other building or enclosure), or other audio environments. Additionally, it may be desirable to reduce some or all of the mid bass resonance typically experienced in the difficult acoustic environments. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software opera- FIG. 1 illustrates a bass compensation system according to an embodiment of the invention. The bass compensation system includes an audio input 10 to which an audio source may be coupled to provide an audio signal to a summing amplifier 11 and 18 dB per octave low pass filter 12 with a corner frequency in the region of 300 Hz. The bass compensation system further includes an 18 dB per octave high pass filter 13 with a corner frequency approximately in the region of 33 Hz. The high pass filter 13 is configured to limit subsonic energy delivered to the amplifier and loudspeakers. The high pass filter 13 may have slopes other than 18 dB per octave as well. For example, the high pass filter 13 may be a 24 dB per octave high pass filter in other embodiments. The high pass filter 13 may provide subsonic loudspeaker protection whether the bass compensation is engaged or not. Other frequencies other than 33 Hz may be used, or in some embodiments the frequency is selectable to limit the maximum excursions of woofers and subwoofers in an automobile sound system. In other embodiments, the high pass filter 13 is not included, for example, limiting subsonic energy is provided by circuitry other than the bass compensation system.

Figure 2:
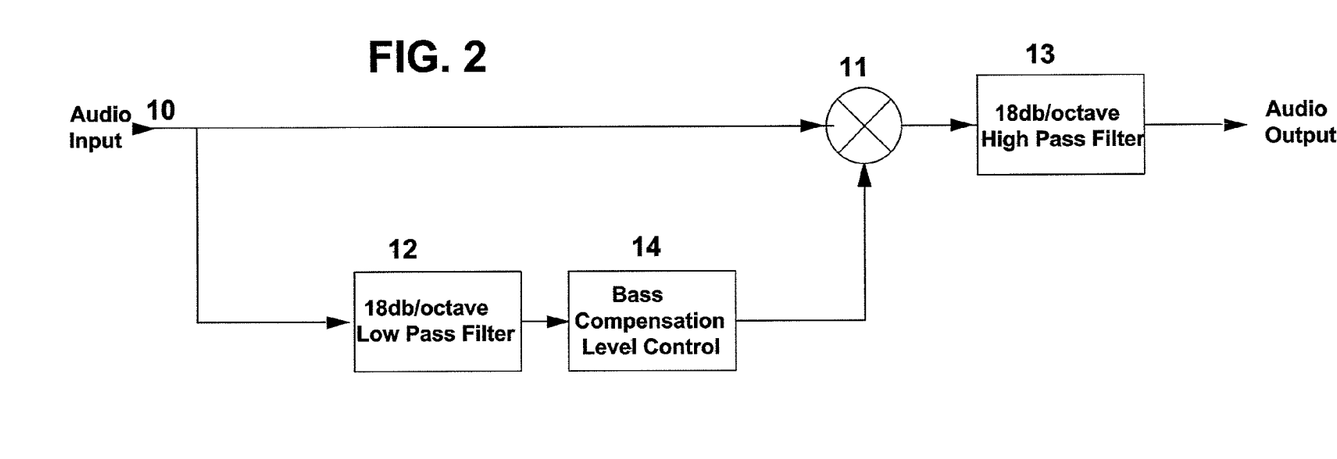
FIG. 2 is a block diagram of a bass compensation system according to an embodiment of the present invention.

FIG. 2 illustrates a bass compensation system according to an embodiment of the invention. Similar to the bass compensation system of FIG. 1, the bass compensation system of FIG. 2 includes a summing amplifier 11, a low pass filter 12, and a high pass filter 13. The bass compensation system of FIG. 2 further includes a level control circuit 14 configured to control the amount of bass compensation applied to the summing amplifier 11 is shown in FIG. 2. The level control 14 after the 18 dB per octave low pass 12 provides a means to control the amount of bass compensation applied to the summing amplifier 11. The level control circuit 14 could precede the 18 dB per octave low pass filter as well and yield similar results.

Figure 3:
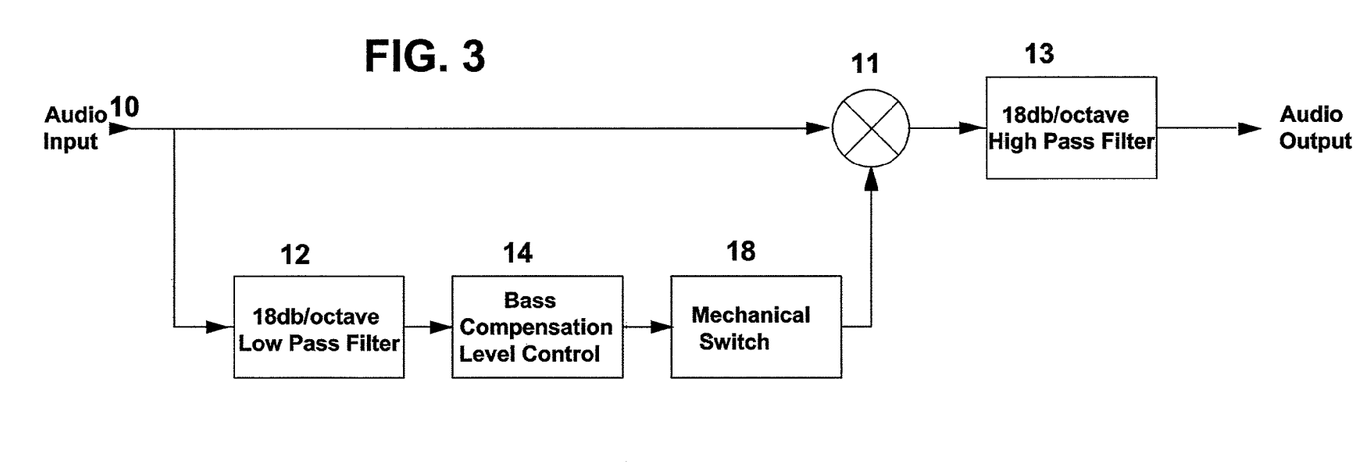
FIG. 3 is a block diagram of a bass compensation system according to an embodiment of the present invention.

FIG. 3 illustrates a bass compensation system according to an embodiment of the invention. The bass compensation system of FIG. 3 includes similar blocks as those illustrated in FIG. 2, and the same reference numbers are used for blocks previously described. The bass compensation system of FIG. 3, however, further includes a switch 18 coupled to the level control circuit 14 which may be used to manually switch in and out the bass compensation is shown in FIG. 3. The switch 18 is illustrated in FIG. 3 as coupled after the bass compensation level control 14 and the low pass filter 12. A mechanical switch 18 could also be located at the input of the 18 dB per octave low pass filter 12.

Figure 4:
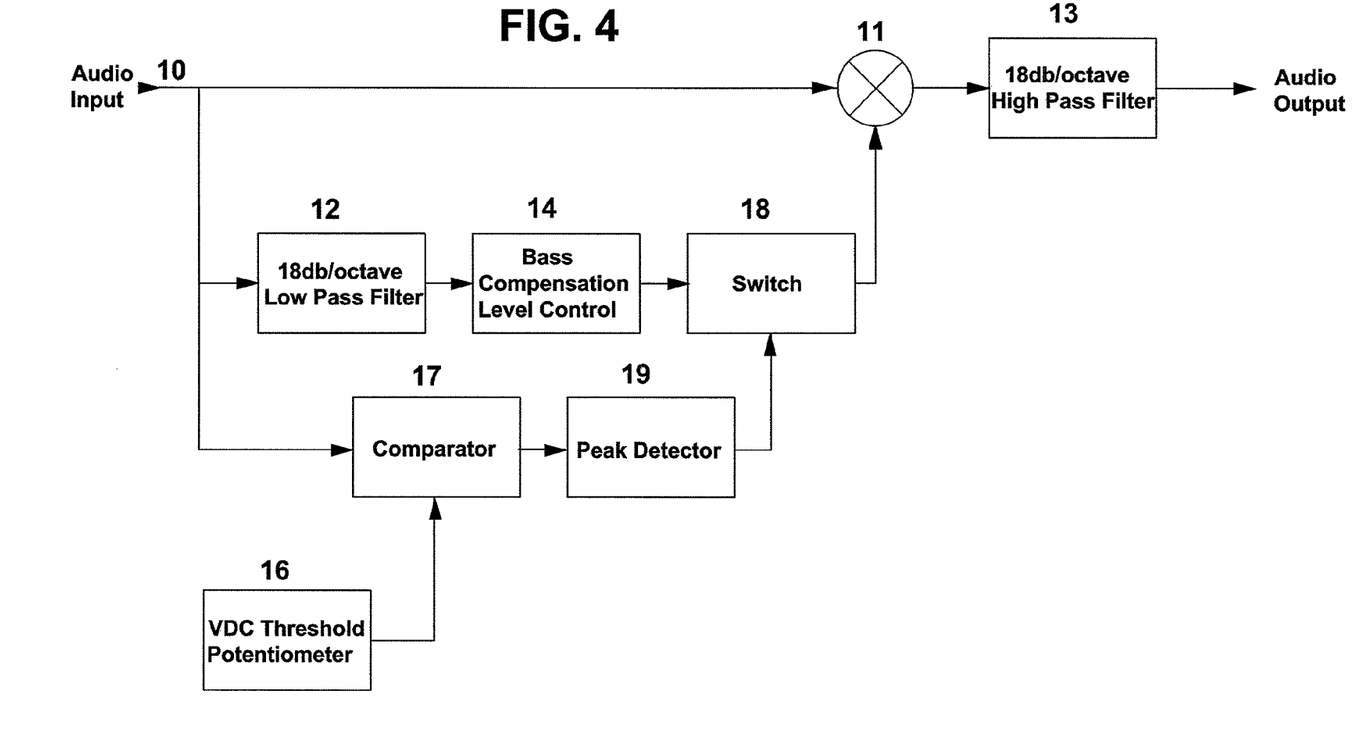
FIG. 4 is a block diagram of a bass compensation system according to an embodiment of the present invention.

FIG. 4 illustrates a bass compensation system according to an embodiment of the invention. In addition to the blocks previously described with reference to FIGS. 1-3, the bass compensation system of FIG. 4 includes circuits configured to automatically engage the bass compensation at a predetermined audio level. The bass compensation system includes an adjustable DC threshold potentiometer 16 that may be used to set the reference input of a comparator 17. The output of the comparator 17 coupled to a peak detector 19 provides a signal that is used to turn on the switch 18. Other types of semiconductor or mechanical switches may be used for the switch 18 to engage the bass compensation circuit.

Figure 5:
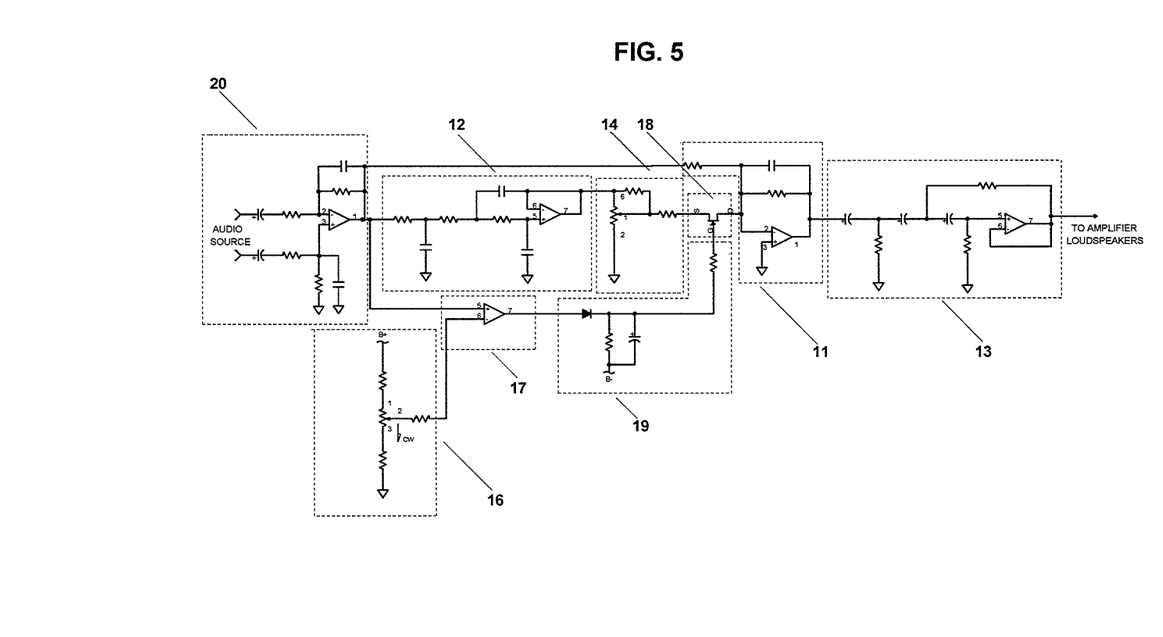
FIG. 5 is a schematic diagram of a bass compensation system according to an embodiment of the invention.

FIG. 5 illustrates a bass compensation system according to an embodiment of the invention. The bass compensation system of FIG. 5 represents an analog, implementation of a bass compensation system according to an embodiment of the invention, in that various blocks included in the previously described embodiments of the invention are implemented using analog circuitry. An input stage 20 includes a differential amplifier 20 driven from various signal levels, low level at line level or directly connected to loudspeaker outputs from an automobile factory radio. A single ended inverting or non-inverting amplifier would also work equally as well at this stage.

The input stage 20 drives a summing amplifier 11 and 3rd order Chebyshev 18 dB per octave low pass filter 12 having an output level determined by level control 14 and switch 18. Typically a 3rd order shelving circuit with zero compensation for the two additional poles would be used with a standard tone control type circuit.

In further detail, still referring to the invention of FIG. 5 a 3rd order 18 dB per octave high pass filter 13 is included to limit energy below 33 Hz. A potentiometer 16 coupled to a negative input of a comparator 17 may be adjusted to select a DC voltage between ground and +B volts. A positive input of the comparator 17 is coupled to the output of the input stage 20. The output of the comparator 17 is provided to a peak detector 19 that is used to control the switch 18 and provide bass compensation engaged at a predetermined audio input level. The use of peak detector 19 may be useful if the compensation is intended to be used for bass roll off that only occurs at high input levels or be additionally engaged at low levels compensating for the audible bass roll off the human ear at low levels. The peak detector 19 may be configured to have a long time constant such that the switch 18 is closed (i.e., conductive) during musical intervals.

The circuits illustrated in FIG. 5 may be used for various ones of the blocks of the bass compensation systems of FIGS. 1-4, previously discussed. For example, the system of FIG. 2 may include the input stage 20, the 3rd order Chebyshev 18 dB per octave low pass filter 12, the level control 14, the switch 18, summing amplifier 11, and the 18 dB per octave high pass filter 13.

In a broad embodiment, the invention may be used in one or many channels depending on the audio system. Typically for use with subwoofers this either is one or two channels. If two channels were required the level control 14 of FIG. 5, for example, would typically use a dual type potentiometer to control the bass compensation simultaneously to both channels.

Figure 6:
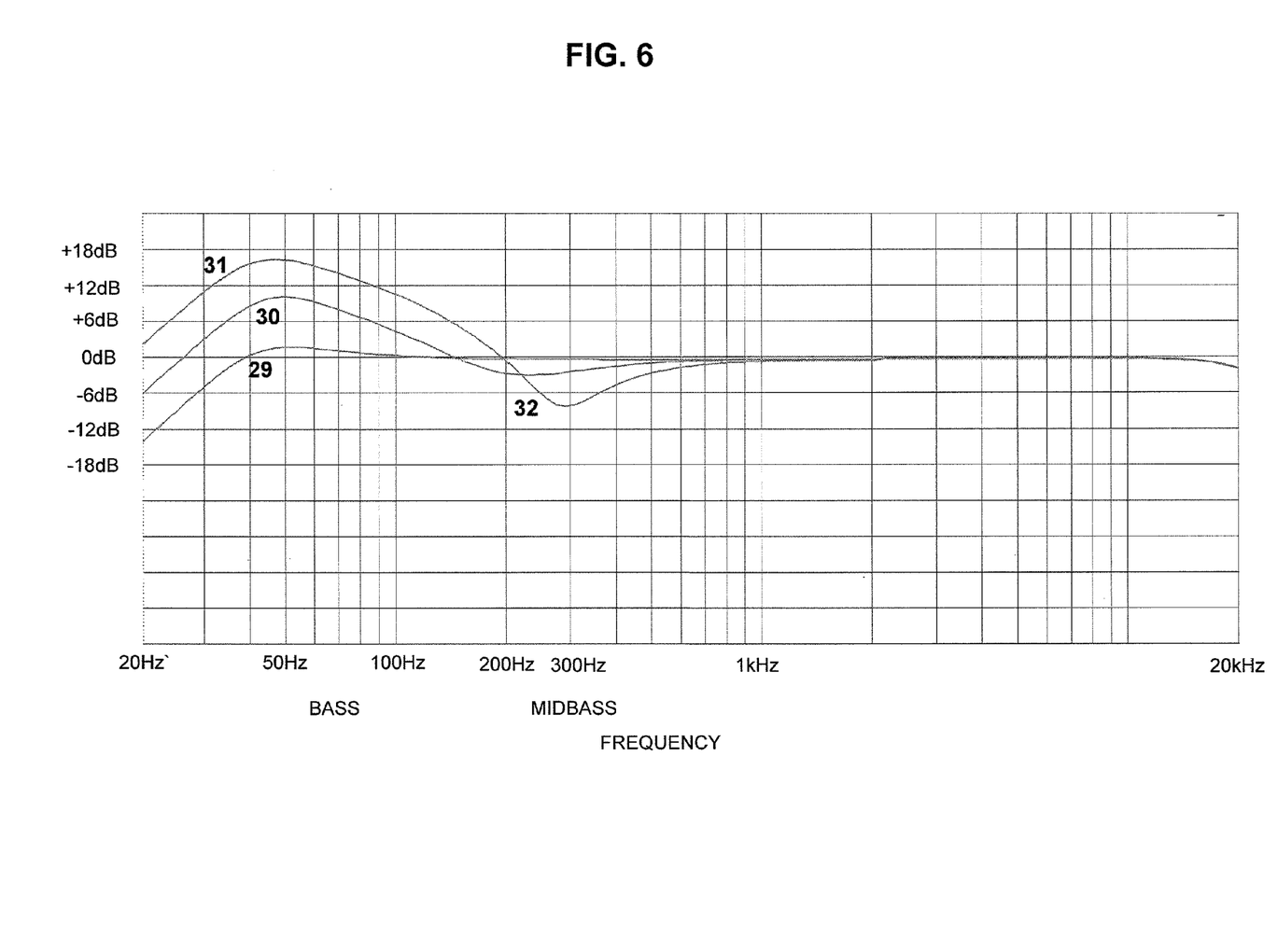
FIG. 6 is a frequency response diagram according to an embodiment of the invention.

FIG. 6 illustrates frequency response curves for a bass compensation system according to embodiment of the invention. The frequency response 29 represents the response with the bass compensation level control 14 in a minimum level position. The frequency response 30 represents the response with the bass compensation level control 14 in a mid level position. The frequency response 31 represents the response with the bass compensation level control 14 in a maximum level position. Referring to FIG. 6 the frequency responses 29, 30, and 31 for a minimum, mid, and maximum levels illustrate frequency rolling off at 50 Hz due to the 18 dB per octave high pass filter 18.

In more detail referring to FIG. 6 the bass compensation system behaves as a bass boost circuit up to the point phase shift produces a controlled amount of attenuation 32 in the mid bass region, for example, at approximately 300 Hz. This reduction may be useful in reducing the effect of resonance within an automobile. For example, with reference to the bass compensation system of FIG. 5 and assuming a maximum bass boost provided by the level control circuit 14 of FIG. 5 a boost of approximately 18 dB at 50 Hz as shown in the curve 31 and a −7 dB dip at approximately 300 Hz 32 of FIG. 6. is provided. The maximum amount of bass compensation may be changed by changing the resistances and/or range of resistances of the level control circuit. In some embodiments, the maximum bass boost may be less than 18 dB, such as 12 dB.

Figure 7:
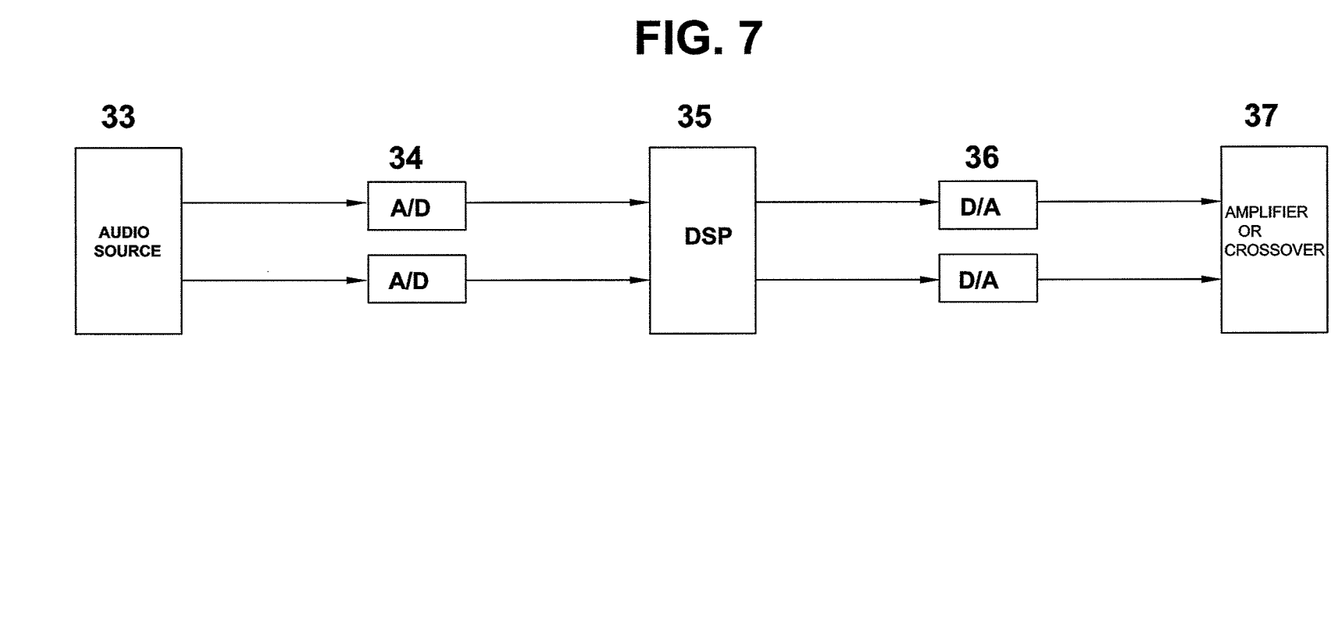
FIG. 7 is a block diagram of a bass compensation system according to an embodiment of the present invention.

FIG. 7 illustrates a bass compensation system according to an embodiment of the invention. An analog audio source 33 typically of two channels is provided to analog to digital converters 34 and the output of the analog to digital converters 34 provided to the DSP digital signal processor 35. The analog to digital converters 34 are configured to convert the analog audio signals into digital audio signals that are provided to the DSP 35. The DSP 35 is configured to transform the digital audio signals to provide a transfer function as previously described with reference to illustrated in FIG. 6. The transformed digital output of the DSP 35 is provided to digital to analog converters 36 which is configured to convert the transformed digital audio signals to analog audio signals. The analog audio signal provided by the digital to analog converters 36 are typically used to drive an audio power amplifier or crossover 37.

Figure 8:
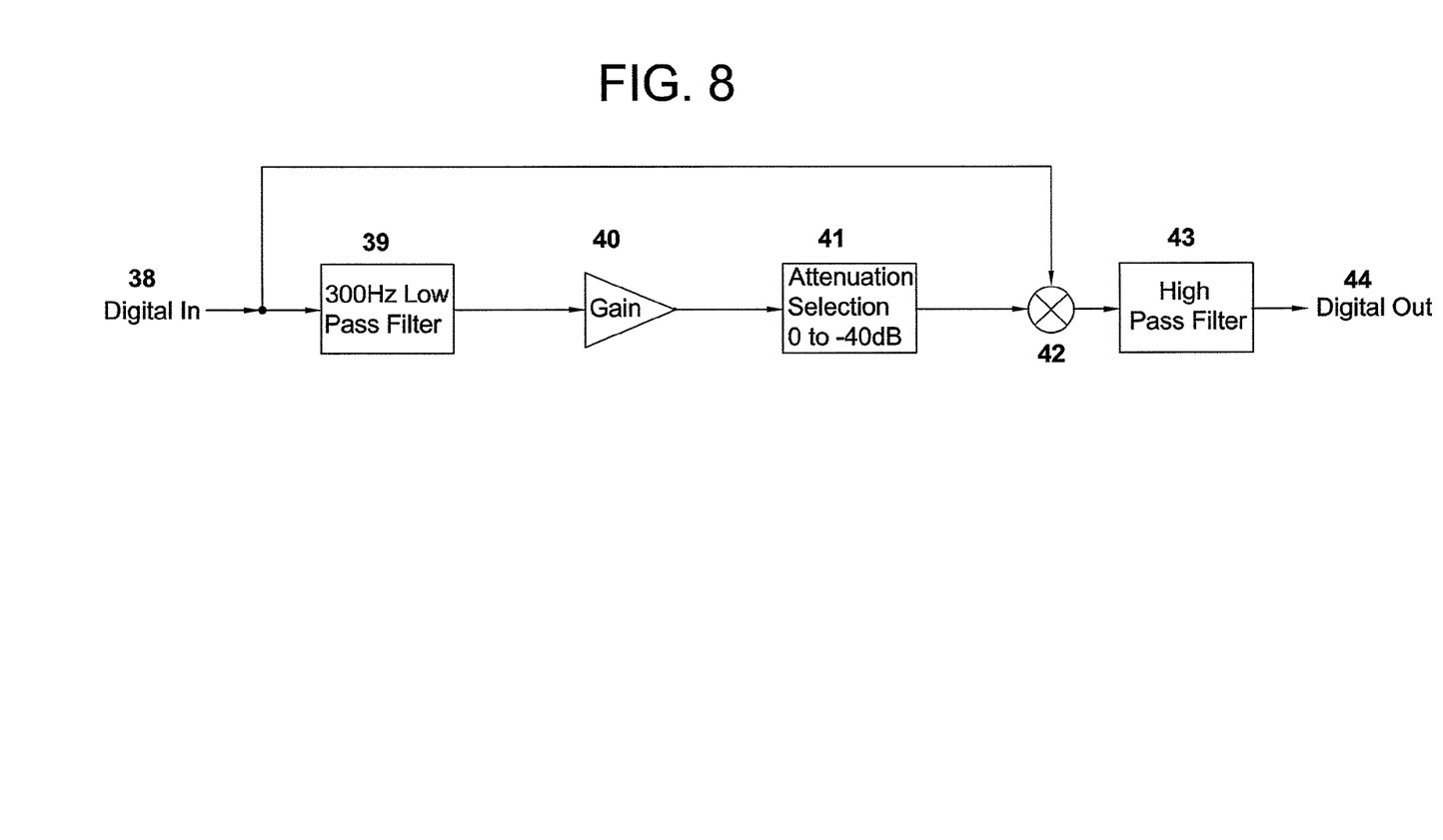
FIG. 8 is a block diagram of a bass compensation embodiment of the present invention.

FIG. 8 illustrates a functional block diagram for the DSP 35 for transforming the digital audio signals according to an embodiment of the invention. Digital audio signals 38 provided to the DSP 35 are provided to summing amplifier 42 and to a low pass filter 39. The low pass filter 39 is illustrated in the embodiment of FIG. 8 as having a corner frequency in the region of 300 Hz, but other frequencies may be used as well in other embodiments. The low pass filter 39 is then provided to a gain stage 40. The output of the gain stage is then provided to an attenuator 41 that will determine the magnitude of the applied bass compensation. The attenuator 41 is illustrated for the embodiment of FIG. 8 as having a range of 0 to −40 dB. Other ranges of attenuation may be used as well, however. The digital output of the attenuator 41 is provided to the summing amplifier 42 where the unprocessed digital audio signals are summed with the processed digital audio signals provided by the attenuator 41. The digital output of the summing amplifier 42 is provided to a high pass filter 43. The high pass filter 43 may be used to limit subsonic energy delivered to the amplifier and loudspeakers. The high pass filter 43 may provide subsonic loudspeaker protection whether the bass compensation is engaged or not. The corner frequency of the high pass filter 43 may be approximately 33 Hz, although other frequencies may be used as well. In some embodiments, the high pass filter 43 is not included. For example, circuitry other than the DSP 35 are used to limit the subsonic energy. The digital output of the high pass filter 43 is then provided to be converted to analog audio signals, for example, by D/A converter 36 shown in FIG. 7.

Figure 9:
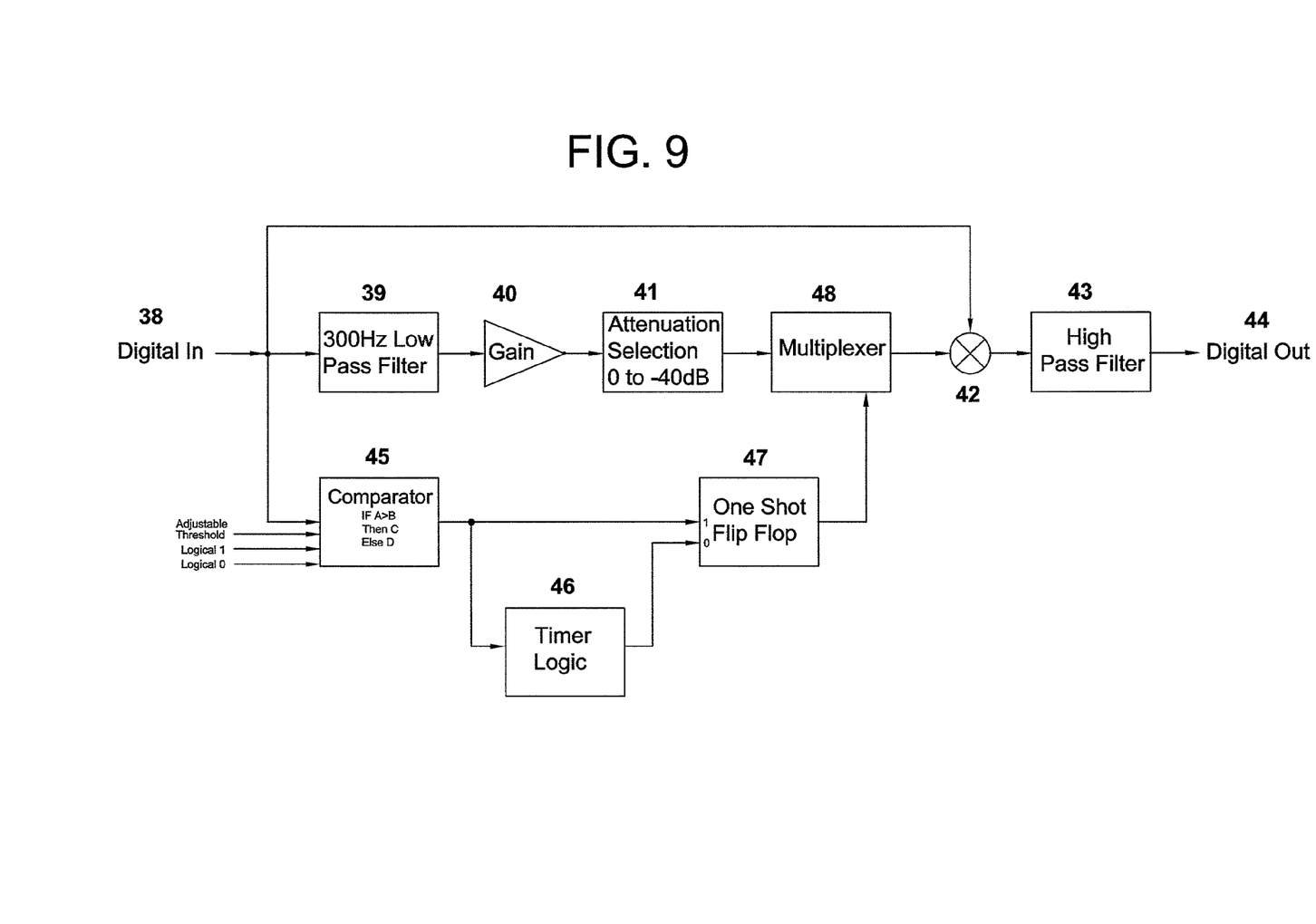
FIG. 9 is a functional block diagram of, a digital signal processor for a bass compensation system according to an embodiment of the present invention.

FIG. 9 illustrates a functional block diagram for the DSP 35 for transforming the digital audio signals according to an embodiment of the invention. The embodiment illustrated in FIG. 9 includes elements previously described with reference to the embodiment illustrated in FIG. 8. The reference numbers of FIG. 8 are also used in FIG. 9 to references common elements. The embodiment of FIG. 9, however, further includes functional blocks for engaging and disengaging bass compensation. For example, the embodiment of FIG. 9 includes a comparator 45 that is configured to determine if the digital audio signals 38 are above or below a threshold selected by a user. The user selection is represented by the adjustable threshold value provided to the comparator 45. The output of the comparator 45 is provided to a one shot flip flop and timer logic 46. In operation, if the magnitude of the digital audio signal 38 exceeds the selected threshold, the output of the comparator 45 outputs a logic 1 to the one shot flip flop 47 causing it to change its state at the output. The change of state at the output of the one shot flip flop is provided to a multiplexer 48 that couples the output of the attenuator 41 to the summing amplifier 42 to engage the bass compensation. When the digital audio signal level falls below the user selected threshold timer logic 46 times out and resets the one shot flip flop 47. Resetting the one shot flip flop opens the multiplexer 48 disengage bass compensation.

It will be appreciated by those ordinarily skilled in the art that with different values of components, embodiments of the invention could also be applied to other sound systems with different acoustic characteristics. For example, sound systems used in difficult acoustic environments, such as boats, motor homes, rooms (e.g., in a home, office, or other building or enclosure, etc.), etc.

Embodiments of the invention may be used to provide reasonably accurate bass compensation for a typical automobile without requiring the operator to have knowledge of auto sound acoustics and electronics. It provides the listener with an effective means to compensate for the limitations of bass reproduction in an automobile that occurs naturally in the human ear especially at lower levels. In many cases, the geometry and volume of most car interiors are reasonably similar with respect to the wavelengths of bass and mid bass frequencies. The bass compensation system may be used to apply equalization similar to that of a house curve used in professional audio to compensate for the acoustics in a room.

In some embodiments of the invention, the bass compensation system uses the inherent steeper slope of a 3rd order filter. Additionally, the inherent mid bass cancellation caused by phase shift greater than 90 degrees may be used as well. The cancellation is strategically placed and limited to reduce the effects of the resonance in the mid bass region.

A 3rd order filter used as tone control would typically incorporate a 2-pole phase compensated circuit to minimize the induced cancellations caused by phase shift. In some embodiments, the bass compensation system described strategically places this cancellation in the 200-300 Hz region where a dominant resonance in an automobile typically exists. Therefore the bass compensation presented here is used as an advantage to construct a bass boost and mid bass cut.

Incorporating a threshold for engaging the bass compensation circuit permits a user to employ the compensation for those bass limitations that occur only at higher volume levels. It permits the user to use the bass compensation circuit for limitations placed on the bass response by factory head units at higher levels. The threshold may also be set to act as a loudness function at low levels of operation where the bass response of the human ear falls off. The time constant of the circuit that engages the bass compensation circuit may be set long enough to stay engaged between typical musical intervals and thus refrain from being switched in or out during music.

The bass compensation level control gradually adds compensation as needed or desired by the user. This control allows the user to vary the compensation with respect to the type of music they are playing, their personal taste and amount needed for their specific system. The car audio enthusiast generally likes more bass, natural sounding or not, thus in this design a maximum boost of +18 dB at 50 Hz may be provided.

In some embodiments of the invention, a 3rd order low pass filter is positioned at 200 Hz and summed with the main channel via the bass compensation level control. The 3rd octave low pass filter has a rising slope that peaks at 50 Hz where a 3rd octave high pass loudspeaker protection system at 33 Hz rolls off at 18 dB per octave. A field effect transistor (FET) may be used as a gate that applies bass compensation as a function of input level. For example, when the audio input to the circuit is high enough, as determined by the threshold control, the peak voltage charges an electrolytic capacitor that holds the FET on for a time sustained by normal music intervals.

A 3rd order high pass circuit may be used to limit the subsonic energy sent to the amplifier and loudspeaker or loudspeakers. It may be desirable to reduce the non-audible, subsonic energy sent to the loudspeaker. A lower order filter may be used if the maximum bass compensation were reduced to a much lower value.

Figure 10:
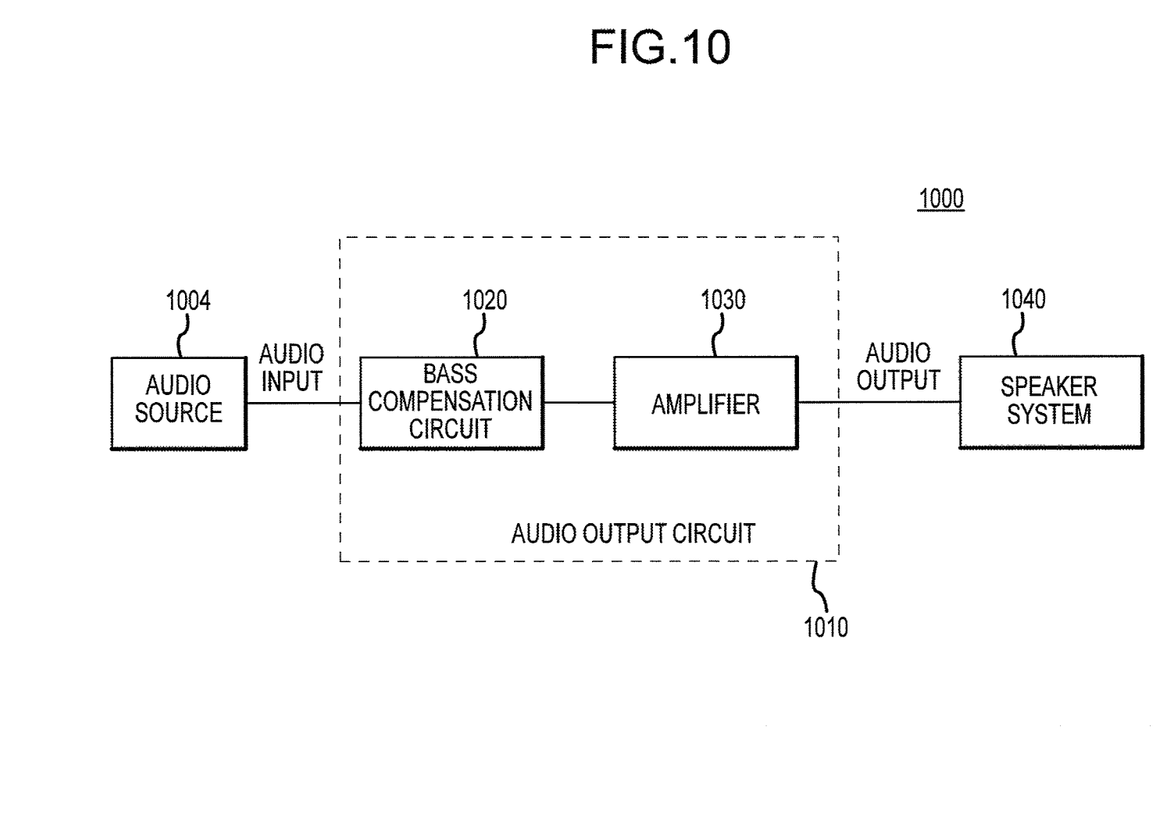
FIG. 10 is a functional block diagram of a system including an audio output circuit including a bass compensation circuit according to an embodiment of the present invention.

FIG. 10 illustrates a functional block diagram for a system including an audio output circuit 1010 including a bass compensation circuit 1020 for transforming audio signals in a room environment (e.g., in a home, office, or other building or enclosure, etc.) according to an embodiment of the invention. The audio output circuit 1010 may be configured to receive an audio input signal from an audio source 1004 and to provide an audio output signal to a speaker system 1040. Examples of the audio source 1004 may include a television, a digital video disk player, a compact disc player, a Blu-ray disc player, a cable or satellite box player, a home audio system, a computer or laptop, a radio, a portable electronic device (e.g., cellular telephone, tablet, portable music player, etc.) or another electronic device, or any combination thereof. The speaker system 1040 may be configured to produce sound based on the audio output signal.

The audio output circuit 1010 may include a bass compensation circuit 1020 coupled to an amplifier 1030. The bass compensation circuit 1020 may be configured to provide an intermediate signal to the amplifier 1030 based on the audio input signal having a boosted bass at a first frequency or frequency range (e.g., a bass boost) according to embodiments of this invention. Further, the bass compensation circuit 1020 may, be configured to provide the intermediate signal to the amplifier having a cut bass at a second frequency or frequency range (e.g., a mid-bass cut) according to embodiments of this invention. The bass compensation circuit 1020 may include the bass compensation systems of FIGS. 1-3, at least a portion of the bass compensation system of FIG. 5, or any combination thereof. In some embodiments, the first frequency or frequency range is less than the second frequency or frequency range. For example, the bass compensation circuit 1020 may implement a maximum bass boost at approximately 50 Hz and a mid-bass cut at between frequencies 150 Hz and 300 Hz. The magnitude of the bass boost may be configurable and the magnitude of the mid-bass cut may be configurable. In some embodiments, a magnitude of the bass boost may be up to 12 dB and a magnitude of the mid-bass cut may be less than 6 dB. Additionally, the bass compensation circuit 1020 may be disabled or bypassed such that the audio input signal is provided directly to the amplifier 1030. The bass boost with a mid-bass cut may combat the effects of nulls in a room environment created by standing waves and bass roll off by a device providing the audio input to protect small speakers.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A bass compensation system, comprising:
   a low pass filter configured to receive an audio signal from an audio source and provide a filtered audio signal, the low pass filter having a roll off of at least 18 dB per octave; and
   a summing amplifier coupled to the low pass filter and configured to sum the audio signal from said audio source and the filtered audio signal to provide a summed audio signal,
   wherein the summed audio signal provided by the summing amplifier includes a bass boost of at least 12 dB at a first frequency up to a point where a phase shift produces a mid bass cut at a second frequency greater than the first frequency.

2. The bass compensation system of claim 1, further comprising a level control circuit coupled to the low pass filter to receive the filtered audio signal from the low pass filter, the level control circuit configured to provide control of the amount of bass boost and mid bass cut.

3. The bass compensation system of claim 1, further comprising a switch coupled to the low pass filter and the summing amplifier, the switch configured to couple and decouple the summing amplifier and the low pass filter to engage and disengage bass compensation.

4. The bass compensation system of claim 1, further comprising a switch coupled to the low filter and configured to selectively couple the audio signal to the low pass filter to engage and disengage bass compensation.

5. The bass compensation system of claim 1, further comprising:
   a comparator configured to receive the audio signal and provide an output signal based at least in part on a comparison of the audio signal to a threshold signal;
   a potentiometer coupled to the comparator and configured to set a level of the threshold signal; and
   a switch coupled to the low pass filter and the summing amplifier, and further coupled to a peak detector, the switch configured to couple and decouple the low pass filter and the summing amplifier responsive to an activation signal from the peak detector.

6. The bass compensation system of claim 1 wherein the low pass filter comprises an analog circuit.

7. The bass compensation system of claim 1 wherein the low pass filter comprises a digital signal processor.

8. The bass compensation system of claim 1 wherein the first frequency is approximately 50 Hz and the second frequency is approximately 300 Hz.

9. A method of providing bass compensation for a bass response in an automobile comprising:
   low pass filtering, by a low pass filter, an audio signal from an audio source with at least an 18 dB per octave low roll off;
   phase shifting, by the low pass filter, the low pass filtered audio signal with respect to the audio signal to provide a phase shifted, low pass filtered audio signal that is out of phase with the audio signal a different amount respective to the frequency of the audio signal;
   summing the audio signal from the audio source and the phase shifted, low pass filtered audio signal, wherein the summed result includes a bass boost at a first frequency and mid bass out at a second frequency greater than the first frequency based on a phase difference between the phase shifted, low pass filtered audio signal and the audio signal; and
   high pass filtering sub sonic energy from the summed result.

10. The method of claim 9 wherein the high pass filtering has a 24 dB per octave roll off.

11. The method of claim 9, further comprising converting the audio signal into a digital audio signal and providing the digital audio signal for low pass filtering.

12. A bass compensation system for compensating for a response of an automobile, the system comprising:
- a 3rd order low pass filter configured to receive an audio signal from an audio source and provide a filtered audio signal, the 3rd order low pass filter further configured to phase shift the filtered audio signal a different amount per frequency with respect to the audio signal, wherein lower frequencies are phase shifted less than higher frequencies;
- a level control coupled to the 3rd low pass filter and configured to adjust a magnitude of the filtered audio signal and provide a level adjusted filtered audio;
- a summing amplifier coupled to the level control and configured to receive the level adjusted filtered audio signal and the audio signal, and provide a summed audio signal; and
- a 12 dB per octave sub sonic high pass filter configured to receive the summed audio signal from the summing amplifier,
- wherein the summed audio signal includes a bass boost up to a point the phase shift produces a controlled mid bass cut to compensate for the response of an automobile based on the phase shift provided by the 3rd order low pass filter, and wherein an amount of bass boost and mid bass cut included in the summed audio signal is simultaneously adjusted by the level control.

13. A system, comprising:
- a circuit configured to receive an audio signal, low pass filter and phase shift the audio signal and to provide a phase shifted, low pass filtered audio signal;
- an audio output circuit configured to receive the audio signal, sum the audio signal with the phase shifted, low pass filtered audio signal and to provide an audio output signal having a bass boost at a first frequency and mid bass cut at a second frequency that is greater than the first frequency, wherein the phase shifted, low pass filtered audio signal provides the bass boost to the audio signal at the first frequency due to the phase shifted, low pass filtered audio signal being in phase with the audio signal at the first frequency, and wherein the phase shifted, low pass filtered audio signal provides the mid bass cut to the audio signal due to the phase shifted, low pass filtered audio signal being out of phase with the audio signal at the second frequency.

14. The system of claim 13, further comprising a speaker system configured to receive the audio output signal and to produce sound based on the audio output signal.

15. The system of claim 13, wherein the audio output circuit comprises:
- a bass compensation circuit configured to receive the audio signal, the bass compensation circuit configured to produce an intermediate signal having the bass boost at the first frequency and the mid bass cut at the second frequency; and
- an amplifier configured to amplify the intermediate signal to produce the audio output signal.

16. The system of claim 13, wherein a magnitude of the bass boost is configurable and a magnitude of the mid-bass cut is configurable.

17. The system of claim 13, further comprising an audio source configured to provide the audio signal, the audio source including a television, a digital video disk player, a compact disc player, a Blu-ray disc player, a cable or satellite box player, a home audio system, a computer or laptop, a radio, a portable electronic device, a cellular telephone, a tablet, a portable music player, or any combination thereof.

* * * * *